(12) United States Patent
Keist

(10) Patent No.: US 8,148,657 B2
(45) Date of Patent: Apr. 3, 2012

(54) KEY FOR SMT APPLICATIONS

(75) Inventor: Christoph Keist, Wattwil (CH)

(73) Assignee: Abatek International AG, Bassersdorf (CH)

( * ) Notice: Subject to any disclaimer, the term of this patent is extended or adjusted under 35 U.S.C. 154(b) by 381 days.

(21) Appl. No.: 12/443,928

(22) PCT Filed: Sep. 24, 2007

(86) PCT No.: PCT/CH2007/000469
§ 371 (c)(1),
(2), (4) Date: Apr. 1, 2009

(87) PCT Pub. No.: WO2008/040132
PCT Pub. Date: Apr. 10, 2008

(65) Prior Publication Data
US 2010/0000847 A1    Jan. 7, 2010

(30) Foreign Application Priority Data

Oct. 3, 2006 (CH) ................................. 1572/06

(51) Int. Cl.
*H01H 1/10* (2006.01)
(52) U.S. Cl. .................. 200/512; 200/514; 200/292
(58) Field of Classification Search .............. 200/5 A, 200/512–517, 310, 313, 314, 292, 294, 296; 29/622; 400/490–496; 341/22; 345/168–170
See application file for complete search history.

(56) References Cited

U.S. PATENT DOCUMENTS

| | | | |
|---|---|---|---|
| 4,366,355 A | | 12/1982 | Oelsch |
| 4,729,679 A | * | 3/1988 | Hou ............................. 400/490 |
| 5,046,142 A | * | 9/1991 | Ipcinski ....................... 200/16 F |
| 5,760,352 A | * | 6/1998 | Ishihara et al. ............. 200/16 D |
| 5,960,942 A | * | 10/1999 | Thornton ....................... 200/314 |
| 6,303,888 B1 | * | 10/2001 | Okamoto et al. ............. 200/517 |
| 6,720,892 B1 | * | 4/2004 | Lachor ............................ 341/22 |
| 6,936,783 B2 | * | 8/2005 | Kawaguchi et al. .......... 200/514 |
| 7,151,236 B2 | * | 12/2006 | Ducruet et al. ............... 200/406 |
| 7,217,893 B1 | * | 5/2007 | Huang et al. .................. 200/1 B |

FOREIGN PATENT DOCUMENTS

| | | |
|---|---|---|
| DE | 4317176 A1 | 11/1994 |
| DE | 10255338 B3 | 5/2004 |
| EP | 0036570 A2 | 9/1981 |
| EP | 0938111 A2 | 8/1999 |
| EP | 1037226 A2 | 9/2000 |
| JP | 08022731 A  * | 1/1996 |
| JP | 2003242857 A  * | 8/2003 |

* cited by examiner

*Primary Examiner* — Michael Friedhofer
(74) *Attorney, Agent, or Firm* — The Webb Law Firm

(57) ABSTRACT

A key for intermittently electrically contacting at least two conductors located on a circuit board with an electrically conducting contact element includes at least one base that is disposed on the circuit board and a key which encompasses the contact element and is movable relative to the circuit board and the base. The key is connected to the base by at least one movable membrane. The base and the membrane are made of an insulating elastic material. The key additionally includes at least one soldering leg of which the first end is positively inserted in to the base while the second end, the soldering zone, is used for fastening the key to the circuit board.

20 Claims, 5 Drawing Sheets

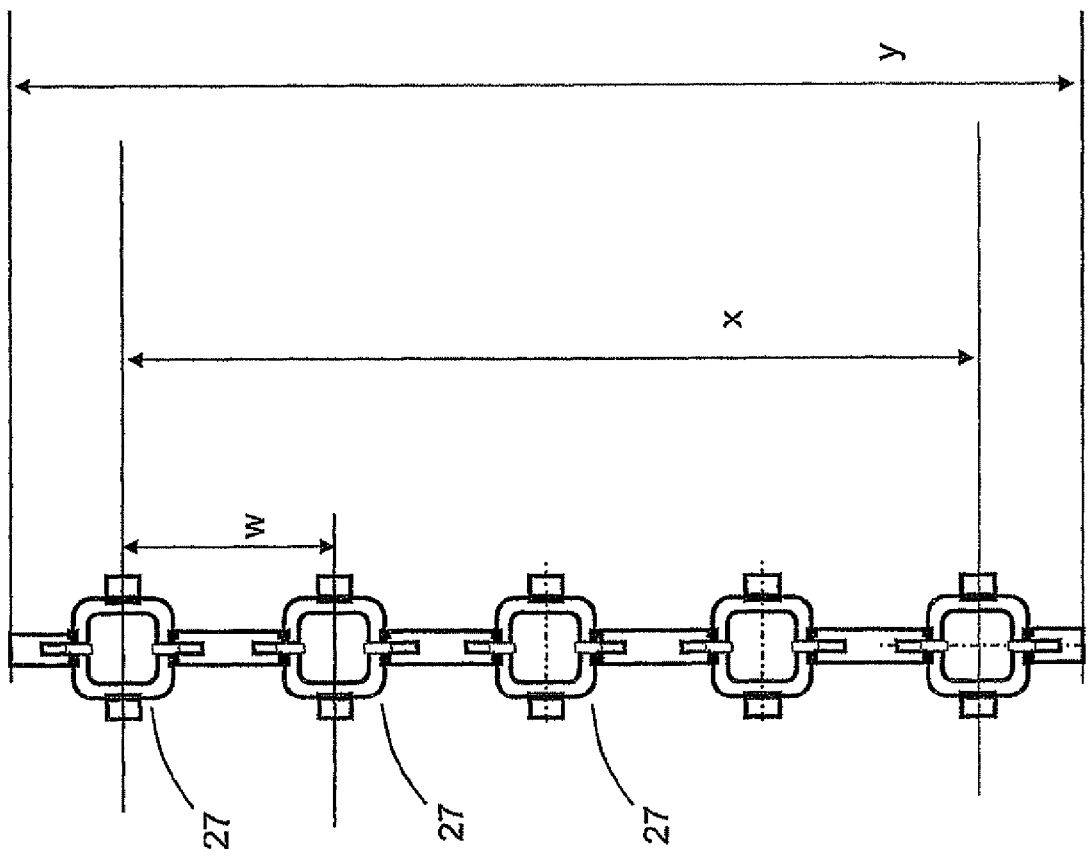

KEY FOR SMT APPLICATIONS

BACKGROUND OF THE INVENTION

1. Field of the Invention

The present invention relates to a key for intermittent electrical contact-connection of at least two conductors arranged on a printed circuit board to an electrically conductive contact element, in particular for fixing on the printed circuit board in the context of SMT technology. In this case, the key has at least one base arranged on the printed circuit board and also a key head—which is movable relative to the printed circuit board and the base—with the contact element, wherein the key head is connected to the base by means of at least one movable membrane, and wherein base and membrane are composed of an insulating elastic material. The present invention furthermore relates to methods for producing such a key or arrangements of such keys and uses of such keys.

2. Description of Related Art

Contact key switches are used for example for mobile telephones, remote controls and also for applications for example in vehicles, etc. They are normally based on keys or arrangements of keys which are composed of a rubber-like elastic material (normally silicone) and which are arranged on a printed circuit board, and wherein a contact element (for example a contact pellet composed of metal or carbon) is arranged on the underside of an actual key head, such that when this key head is depressed, the contact element is pressed onto the printed circuit board in such a way that conductors arranged thereon are connected to one another. Constructions of this type are disclosed in EP 0938111 for example.

Nowadays there are two fundamental solution approaches for realizing such a keypad with an overlying plastic cap.

The first solution involves silicone switching mats having at least one switching dome, but in general usually a plurality of switching domes on a mat. The switching domes are actuated by means of the plastic cap and yield a clearly defined force-displacement characteristic curve (tactile feedback). When the electrically conductive contact pellet touches the printed circuit board, the contact is closed and the switch is thus actuated. Switching mats are usually placed onto the printed circuit board manually. Backlighting of the plastic caps is effected by means of LEDs (light emitting diode) applied on the printed circuit board.

The second solution involves so-called tact switches. Tact switches are individual switching domes which are provided with one or more little feet which are soldered on the printed circuit board. Mounting is usually effected automatically by the SMT method (surface mount technology). The tact switches available nowadays are of complex construction and therefore very expensive. Backlighting of the plastic caps is usually effected by means of LEDs applied on the printed circuit board, but more recent variants also already have backlighting integrated in the tact switch. Only a few force-displacement variants are usually available.

SUMMARY OF THE INVENTION

Accordingly, the invention is based on the object of providing an improved key or an improved contact key switch. What is specifically involved, in particular, is improving a key with tactile feedback for intermittent electrical contact-connection of at least two conductors arranged on a printed circuit board to an electrically conductive contact element (e.g. contact pellet, electrically conductive coating or metal dome). In this case, the key has at least one base arranged on the printed circuit board and also a key head—which is movable (normally lowerable) relative to the printed circuit board and the base—with the contact element or with an underlying contact element in the form of a metal dome which ensures the tactile feedback and the electrical contact. The key head is connected to the base by means of at least one movable membrane, and the base and the membrane are composed of an insulating elastic material, e.g. (transparent) silicone.

The improvement is now achieved, inter alia, by virtue of the fact that the key additionally has at least one soldering foot which is incorporated by the first end thereof in the base in a positively locking manner and by the second end of which, the exposed soldering region, the key can be fixed on the printed circuit board. In this case, "incorporated in a positively locking manner" should be understood to mean that the soldering foot is incorporated in the base in such a way that it cannot be removed or withdrawn from the base without use of force.

Consequently, the heart of the invention consists, inter alia, in the possibility of the fixing of the key, specifically the soldering feet, not being subsequently fixed to the base (e.g. by adhesive bonding or clamping) but rather being embedded by the one unexposed end in the base substantially completely and in a positively locking manner. In this case, the positively locking connection is preferably reinforced by the fact that the non-exposed end is embodied in such a way that it cannot be withdrawn from the base without the latter being destroyed. This is possible, for example, by virtue of the fact that, in the case of strip-type embodiment of the soldering foot, steps, angles, curvatures or undulations are provided in the non-exposed end, or by virtue of the fact that the non-exposed end is embodied not as a strip but rather to a certain extent in T- or L-shaped fashion, such that it is held in the base. The base is normally a circumferential ring (round, oval or cornered, including with rounded corners) composed of elastic material, in an identical manner to the key head, and the elastic material is normally silicone.

It is an aim of this invention, therefore, to provide a switching dome which can be equipped automatically, comprising the following properties (which occur individually or in combination and are unique particularly in their combination):
- highly cost-effective;
- automatic mounting by means of SMT, delivery on rolls;
- smallest possible structural size;
- both with short stroke 0.2 mm-0.8 mm (metal dome) and with long stroke 0.8 mm-3 mm (switching mat);
- large choice of force-displacement characteristic curves (tailored to customer's requirement;
- with integrated LED for backlighting as an option.

In accordance with a first preferred embodiment, two soldering feet are present which are arranged on opposite sides of the key or respectively the base. The key can thus be fixed optimally on the printed circuit board, for example in a soldering operation.

Preferably, the base is embodied as an element which, on the printed circuit board, runs around the position of the conductors to be contact-connected and from which the at least one soldering foot projects laterally. In other words, the soldering foot preferably bears on the printed circuit board. The soldering foot can have a planar soldering region bearing on the printed circuit board and parallel thereto. The soldering region is therefore to a certain extent a strip which projects laterally from the base. Such a strip typically has a width of 0.5-5 mm, in particular preferably of 1-3 mm. This in the case of a base having a height h in the range of 0.2-2 mm, in particular in the range of 0.5-1.5 mm, and a width in the range of the same order of magnitude.

In order to be able to ensure the positively locking connection, the soldering foot preferably has a vertical section which is arranged substantially perpendicular to the plane of the printed circuit board. Said section is preferably arranged completely in the base and at the lower end of which the soldering region is arranged.

In particular with regard to a stabilization of the base it may be advantageous if a circumferential or substantially circumferentially and at most sectionally interrupted stiffening is arranged in the base, said stiffening preferably being embodied in the form of a perforated disk whose plane is arranged parallel to the plane of the printed circuit board. The stiffening and the soldering foot are connected to one another or are formed in one piece. The unit composed of stiffening and soldering foot is preferably produced as a stamped and formed part made from a metallic material.

In accordance with a further preferred embodiment, a soldering insert is incorporated in the base, said soldering insert having a circumferential or circumferentially and at most sectionally interrupted stiffening which is incorporated substantially completely in the base and which is preferably embodied in the form of a perforated disk whose plane is arranged parallel to the plane of the printed circuit board, at which stiffening there are arranged a vertical section which is arranged substantially perpendicular to the plane of the printed circuit board and which is incorporated substantially completely in the base, and, adjacent to said section, a planar soldering region bearing on the printed circuit board and parallel thereto. This soldering insert therefore combines firstly the provision of the possibility of the fixing (soldering feet) and also of the stiffening of the base.

In accordance with a further preferred embodiment, the key head is composed at least partly of transparent or translucent material, and an illumination element, in particular an LED, is furthermore preferably arranged in the key head. The contact-connection of the illumination element can be effected via at least two soldering feet. In this case, the illumination element is in particular preferably contact-connected to the two soldering feet by means of two contact-connection elements (flexible wire, flexible lug) which are preferably incorporated in the membrane. The soldering feet can thus be used for the fixing of the key and at the same time for the driving of the illumination element, which significantly simplifies the production process of circuit arrangements. In order to be able to drive the two poles of the illumination element separately, it proves to be advantageous if a substantially circumferential stiffening interrupted only at two locations is arranged in the base, said stiffening preferably being embodied in the form of a perforated disk whose plane is arranged parallel to the plane of the printed circuit board, and if the contact-connection elements produce an electrical contact between the illumination element and the stiffening, by virtue of the fact that the two poles are linked via the two mutually separate regions of the stiffening. In other words, one soldering foot with one region of the stiffening and a first contact-connection element is connected to the first connection of the illumination element, and the other soldering foot with the other region of the stiffening and the second contact-connection element is connected to the second connection of the illumination element. Thus, it is particularly advantageous for example when two oppositely arranged soldering feet are arranged, and, at least during production, at least two intervening (in the circumferential direction), likewise oppositely arranged mounting connections are arranged, which preferably have a separating gap, which lead to the interruption of the stiffening into the two stated regions having different polarities.

In the case of such a possibility for the connection of an illumination element, it proves to be advantageous if at least one indicator for the connecting direction of the illumination element is arranged in and/or on the key head (e.g. depression, coloration, etc.).

For the above applications comprising one (or more) illumination element, it is necessary, of course, for the soldering feet and a possibly present stiffening or respectively the contact-connection elements to be composed of an electrically conductive material or to have electrically conductive tracks. They are preferably composed of a (tin-plated) metal or of an electrically conductive plastic, wherein soldering feet and stiffening in the case of metal are in particular preferably produced in one piece in a stamping and forming process. The contact-connection elements can be soldered (e.g. wire bonding) or crimped onto such a soldering insert. Possible metallic materials are in particular bronze, CuFe3P (e.g. with nickel coating), SAE 1008, etc.

Furthermore, the present invention relates to a soldering insert for a key such as is described above, wherein the soldering insert particularly preferably has the features described above.

In addition, the present invention relates to a two- (series) and/or three-dimensional (mat) arrangement of keys of a design such as is described above, or of such soldering inserts. In the case of the arrangement, preferably the keys or respectively the soldering inserts are connected to one another via the soldering feet and/or the mounting connections and are preferably separated into individual keys only shortly before the mounting or before the introduction into a mounting apparatus.

Moreover, the present invention relates to a method for producing a key of the type described above or for producing an arrangement such as has been described above. The method is preferably characterized in that the contact pellet and also the soldering feet or the entire soldering inserts, and also if appropriate an illumination element (preferably in already connected, that is to say soldered-together, form) and if appropriate contact-connection element(s), are introduced in an injection mold or compression mold, and in that insulating elastic material (silicone) is subsequently injected and is at least partly solidified in the mold.

Such a method is preferably characterized in that an above-described arrangement of keys is produced and these are subsequently separated from one another to form single keys, in particular preferably along a separating edge which leads to the formation of two sections of the stiffening which are electrically isolated from one another.

Finally, the present invention relates to the use of such a key for fixing on a printed circuit board in particular with the aid of a soldering operation by means of the soldering feet, in particular preferably in the context of SMT technology.

Further preferred embodiments are described in the dependent claims.

BRIEF DESCRIPTION OF THE DRAWINGS

The invention will be explained in more detail below on the basis of exemplary embodiments in connection with the drawings, in which:

FIG. 5 shows a series of such soldering inserts (SMT solder pin array).

DETAILED DESCRIPTION OF THE PRESENT INVENTION

Figure 1:
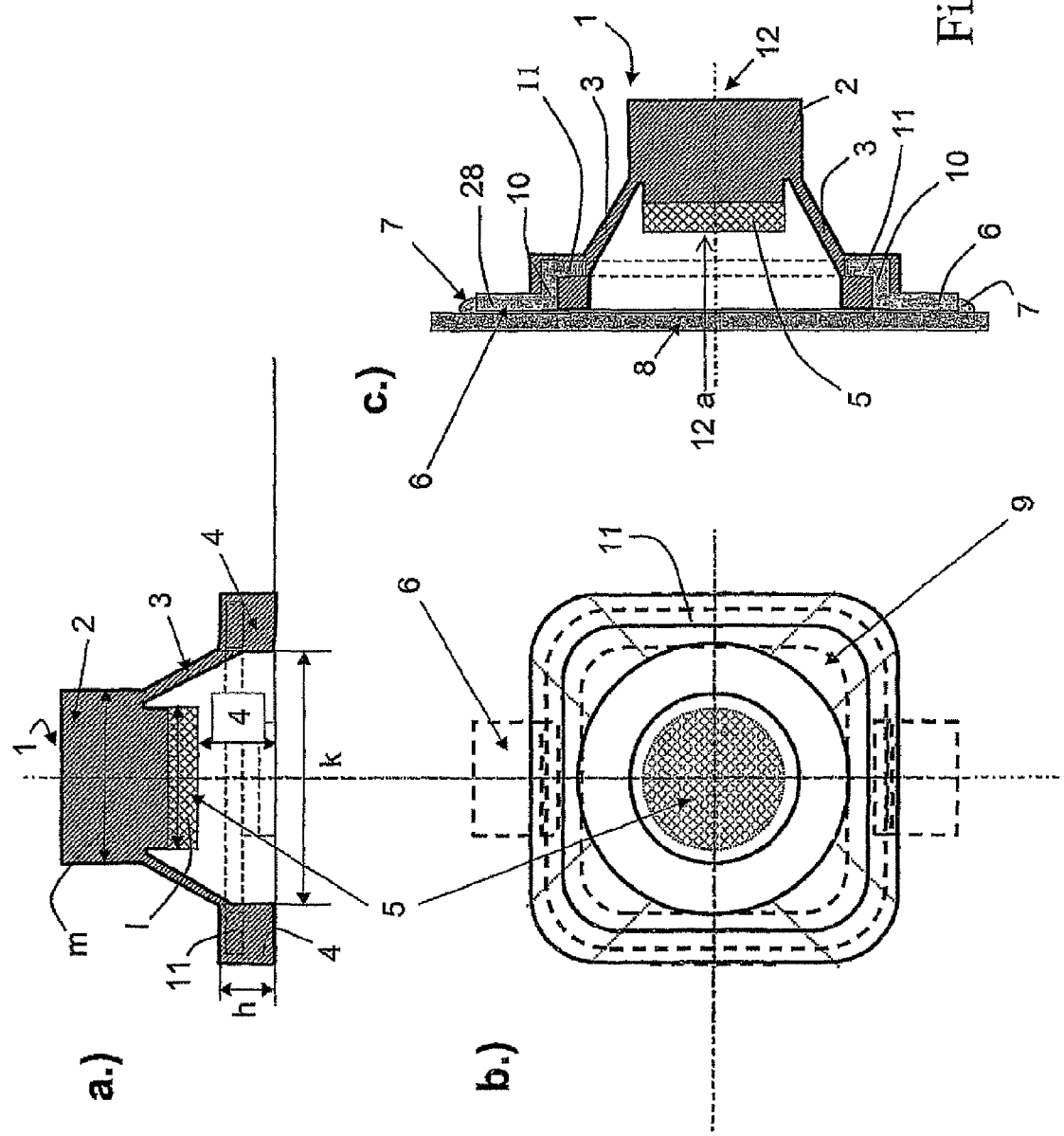
FIG. 1 shows an SMT single key without an LED, wherein a) illustrates a central section in a direction perpendicular to the orientation of the soldering feet, b) illustrates a view from above, and c) illustrates a central section in a direction parallel to the orientation of the soldering feet.

The SMT single key is produced by the same method as a customary switching mat in a compression mold for silicone elastomer. In the mold, firstly an electrically conductive contact pellet is introduced, and then a defined quantity of unvulcanized silicone. Afterward, the mold is closed and the silicone is vulcanized at approximately 170° C. for approximately ten minutes. The shaped switching dome is then removed from the mold, deburred (along a defined tearing edge), and subjected to subsequent heat treatment at 150° C. for 2 h.

The membrane of the switching dome, in combination with the material properties of the silicone type and the spacing of the contact pellet with respect to the base, is designed in such a way that a desired force-displacement curve results upon actuation (tactile feedback).

A novel additional factor now is the SMT solder pin with two little soldering feet. This is a stamped and bent part which fulfils three functions:
a) metal area for enabling an SMT mounting on the printed circuit board (PCB). SMT is the customary method for populating printed circuit boards in large batches.
b) contact area for connecting the LED
c) circumferential stiffening of the base, such that the silicone does not yield during actuation.

The SMT solder pin is introduced into the open mold after the contact pellet and is then completely enclosed by the silicone during the vulcanization (retention by positively locking connection). After the vulcanization, the part is deburred. Since the silicone does not adhere on metal, the region of the little soldering feet is made free of silicone again in the course of deburring. This is effected by means of exactly positioned tearing edges along the material overflow channels. Since introducing an individual SMT solder pin is not very efficient, it is also possible for a plurality of contiguous SMT solder pins in an array to be introduced into a plurality of mold cavities and then to be separated from one another after the vulcanization by means of a small stamping tool.

If the SMT solder pin is provided with a separating gap, the two little soldering feet are electrically isolated from one another by the stamping. This in turn enables the connection of an electrical component, e.g. an LED, between the two little soldering feet.

The LED for key backlighting is fixed on the SMT solder pin. This can be done by soldering (SMT) onto flexible lugs or else preferably by wire bonding. Wire bonding has the advantage that the wire connection can be adapted as desired to the membrane geometry and that the wires are very flexible and therefore do not or hardly impair the force-displacement curve of the key. During the vulcanization, the transparent silicone then simply flows around the LED together with the SMT solder pin and they are thus integrated into the component in a watertight manner. The light scattering can be set by varying the key head surface quality and also the material color.

Finally, the part is subjected to subsequent heat treatment in order to prevent silicone outgassing.

If the LED functions only in one direction, an arrow or some other symbol for the connecting direction can be fitted to the key head, e.g. by means of a corresponding depression in the mold.

FIG. 1 illustrates such a single key 1 in various views. The single key or SMT single key 1 comprises a key head 2 and also a circumferential base 4. A likewise circumferential membrane 3 is arranged between the base 4 and the key head 2. Base 4, membrane 3 and key head 2 thus form the actual dome, and all three elements are composed of silicone. A contact element 5, for example a contact pellet 5 composed of metal or conductive plastic, is arranged on the underside 12a of the key head 2.

The tin-plated soldering feet 6 are then anchored in a positively locking manner in the base 4. The soldering region 28 of said soldering feet projects from the base, and a vertical region 10 is completely embedded in the base 4. Furthermore, there is arranged in the base a stiffening 11, which in this case is embodied as a perforated disk and which is embedded circumferentially in the entire base.

Such a key 1 is fixed on the printed circuit board 8 by means of two soldering locations 7. For dissipating heat that possibly arises below the dome, it can be advantageous if hot air can be led away or respectively cool air can be fed in via venting channels in a diagonal direction. However, the venting channels are also crucial in order to permit the outflow of air upon pressing and an intake of air upon release of the key into the region below the key. If said venting channels or corresponding means (holes in the membrane are also conceivable) are not present, then the key, owing to the air enclosed underneath, cannot be depressed or respectively a key, once depressed, does not relax or does so only very slowly.

Such a key normally has an overall height in the range of 2-5 mm, preferably in the range of 3 to 4 mm. The distance H between the printed circuit board 8 and the underside of the contact pellet 5 is normally approximately 1-2 mm, and opposite limbs of the base 4 have a distance k in the range of 3-8 mm, preferably in the range of 4-5 mm. The key head 2 can be embodied in round fashion and then has for example a diameter m in the range of 2-4 mm. A contact pellet 5 is normally embodied in circular or square fashion and has a diameter 1 in the range of 2-3 mm. The soldering regions 28 project at least 0.5 mm laterally beyond the base, preferably in the range of 0.5 m-2 mm.

The metal sheet from which the soldering feet and the stiffening are produced (in one piece in a stamping and forming method), normally has a thickness in the range of 0.2-0.5 mm. The stiffening 11 is completely embedded in the material of the base 4 and nowhere does it emerge from the base 4. The vertical region 10 is preferably likewise completely embedded in the base 4, but can also be partly exposed downward with respect to the printed circuit board, as can be discerned in FIG. 1.

Figure 2:
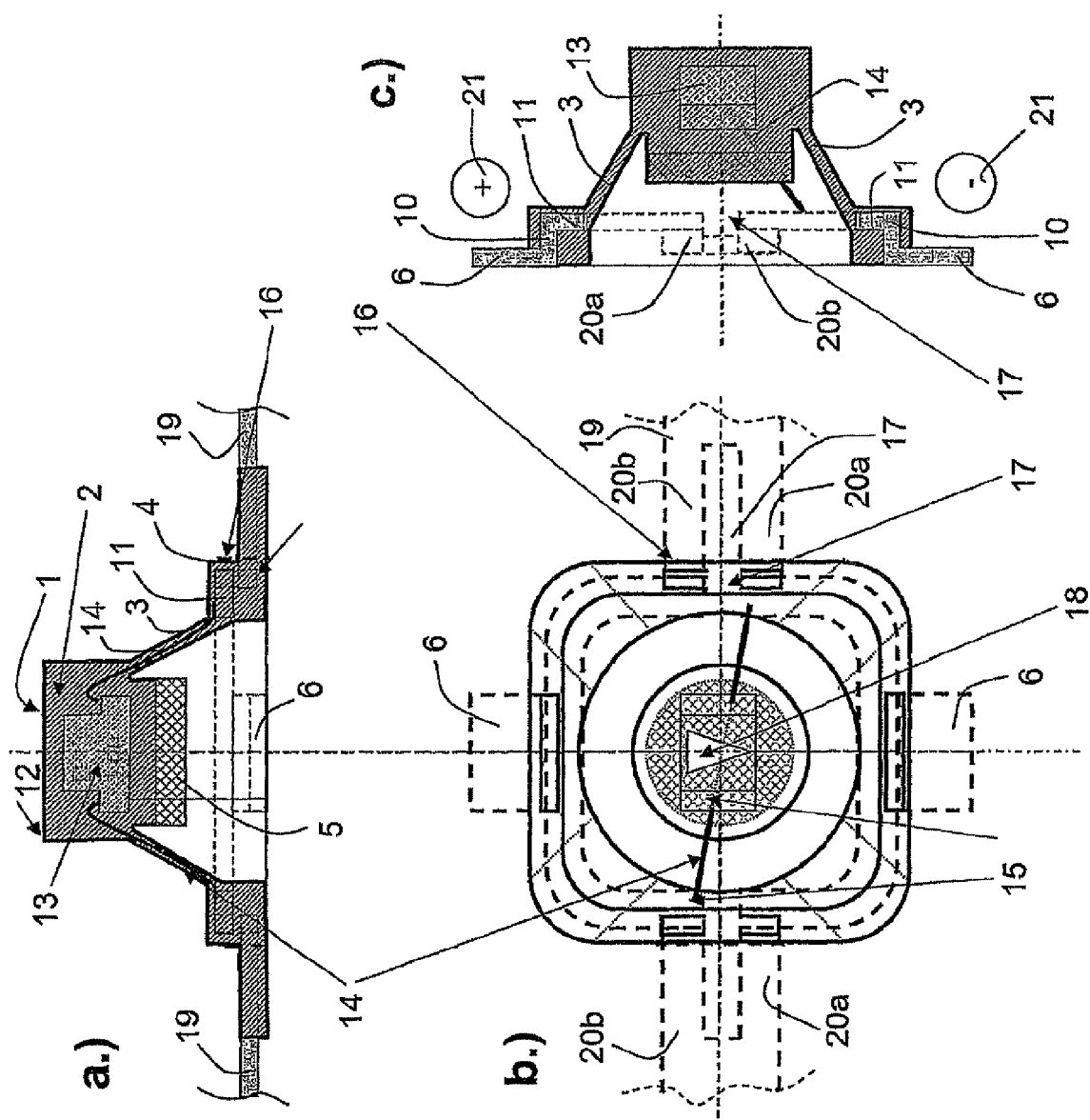
FIG. 2 shows an SMT single key with a long stroke and a contact pellet and also wire bonding of an LED, in illustrations analogous to those in FIG. 1.

FIG. 2 illustrates an SMT single key with a long stroke and a contact pellet and wire bonding of an LED. An LED 13 is integrated in the key head 2. In this case, the two soldering feet 6 serve for driving the LED 13. For this purpose, the stiffening 11 is divided into two regions having different polarities 21. The LED 13 is connected via a first flexible wire 14 to the region having a first polarity, and the second connection of the LED 13 is connected via a second flexible wire 14 to the other region having a second polarity. The connection between the flexible wire 14 and the stiffening and also between the flexible wire 14 and the LED 13 can be a gold-plated soldering location for wire bonding. The two regions of the stiffening 11 are electrically isolated from one another by means of a separating gap 17. FIG. 2 in this case illustrates the situation directly after production in which the two regions are still connected to one another. Specifically, in order to simplify production, the stiffening is initially presented with two laterally linked mounting connections 19 which likewise have a separating gap 17. Prior to the (final) mounting, separation is effected at the separating edge 16 and the two arms 20a and 20b are thus severed and the two regions of the stiffening 11 are therefore electrically isolated from one another. The two regions of the stiffening 11 are to be connected to corresponding conductor tracks on the printed circuit board separately from one another with the two opposite soldering feet 6.

The distance between the underside of the mounting connections 19 with respect to the printed circuit board should be at least 0.2 mm (the interspace is insulated by means of silicone) in order that a short circuit with respect to the printed circuit board can be avoided.

Since an LED normally has a predetermined connecting direction, it proves to be advantageous if an indicator 18 is arranged on the key head, by way of example.

Figure 3:
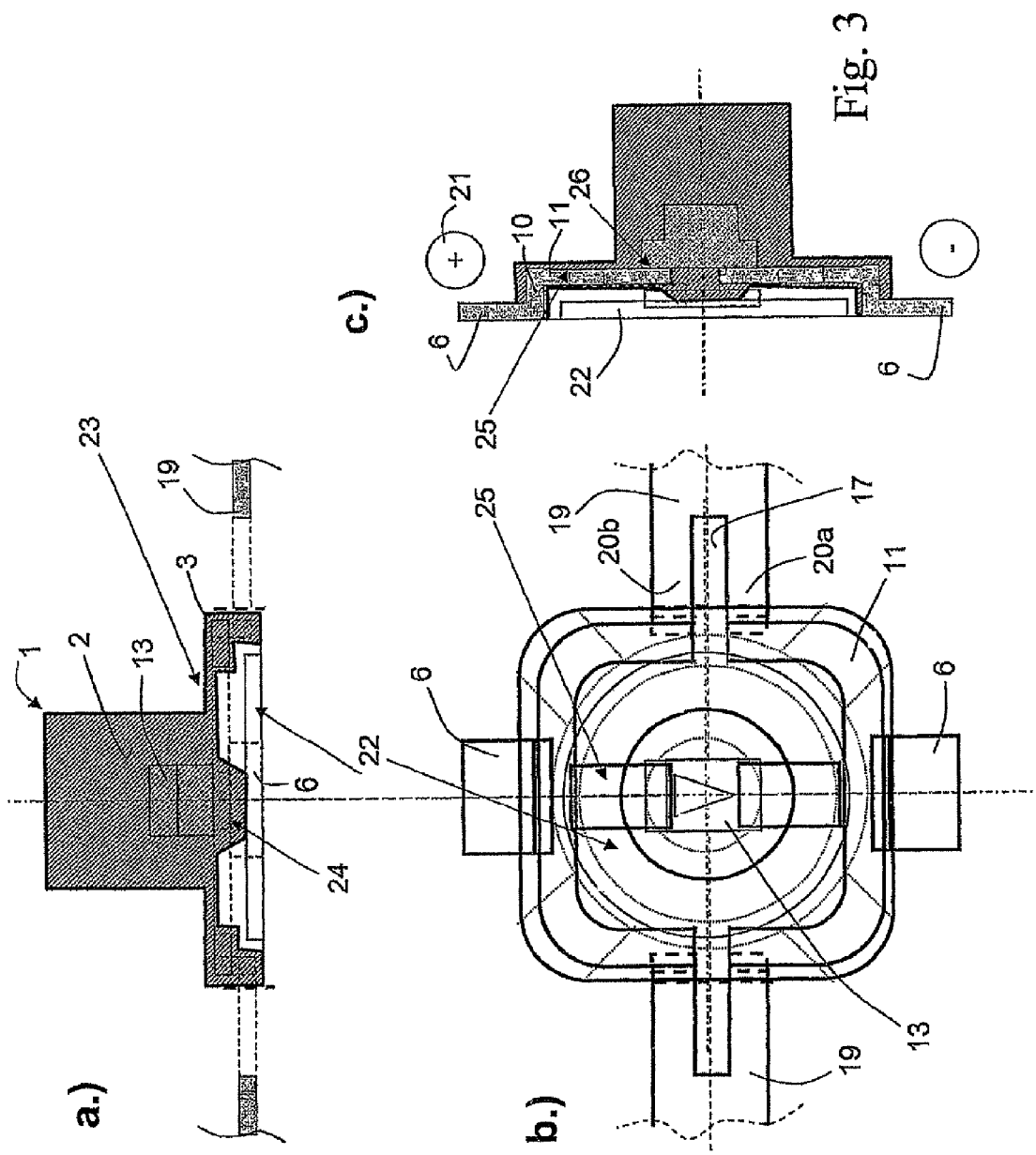
FIG. 3 shows an SMT single key with a short stroke and a metal dome and also SMT soldering of an LED, in illustrations analogous to those in FIG. 1.

FIG. 3 illustrates an SMT single key with a short stroke and a metal dome and SMT soldering of an LED. In this case, the membrane is a flat membrane 23, and the key head 2 has on its underside an actuation plunger 24, which acts on a metal dome 22. The LED arranged in the key head 2 is connected to the two regions of the stiffening via two flexible lugs 25. The two respective connections of the flexible lugs can be provided by means of SMT soldering locations 26.

Figure 4:
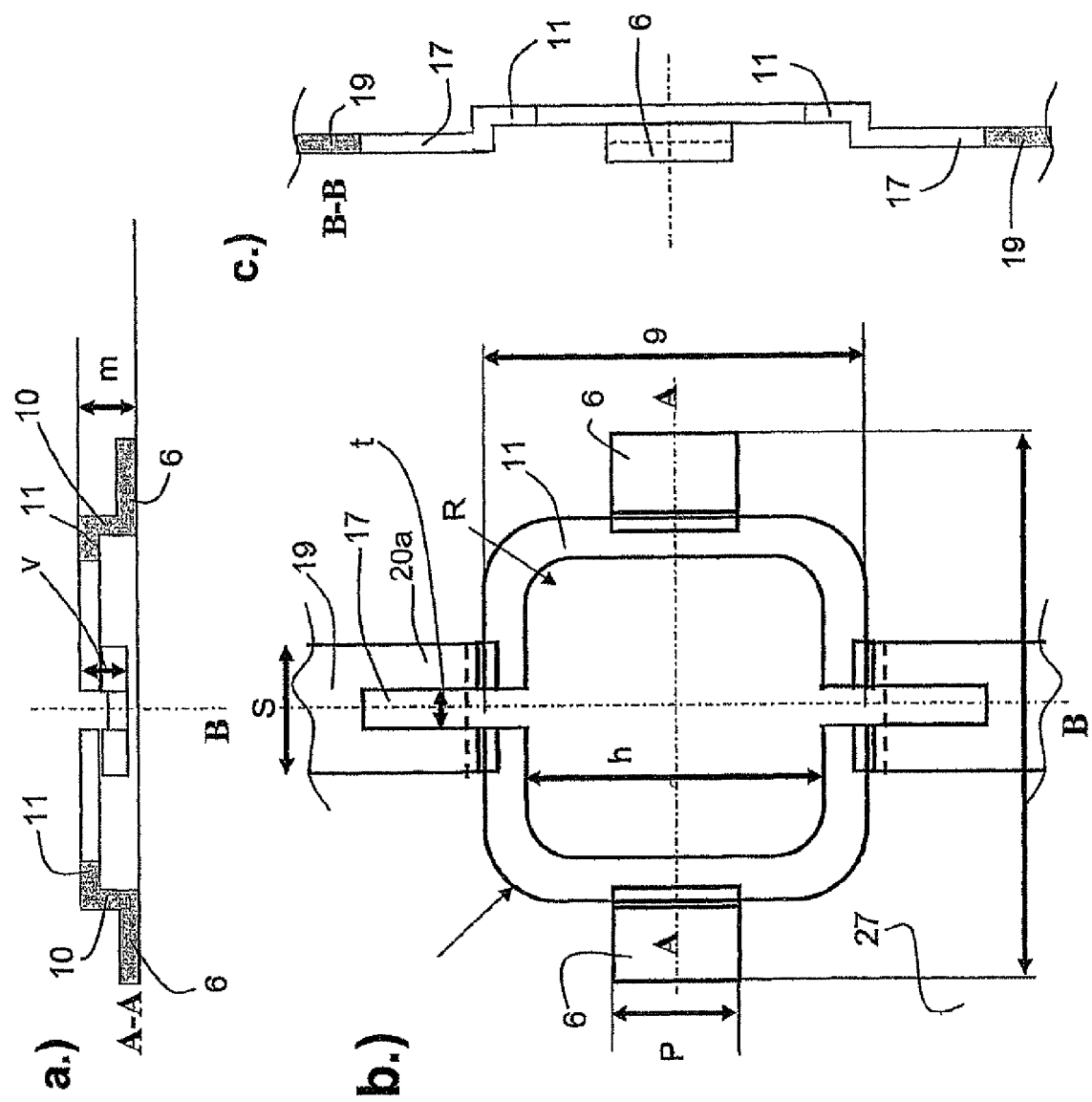
FIG. 4 shows a soldering insert (SMT solder pin), wherein a) illustrates a central section in a direction A-A, b) illustrates a view from above, and c) illustrates a central section in a direction B-B.

FIG. 4 illustrates an SMT solder pin, that is to say a component which can be produced as a stamped and bent part and can be introduced into a mold. It comprises the stiffening 11, the soldering feet 6 and also the mounting connections 19. It can be discerned in this figure that the soldering feet 6 have a width p in the range of 1-3 mm, and the mounting connections 19 have a width likewise in the range of 1-3 mm. The distance between the two arms 20a and 20b is preferably at least 0.5 mm. The stiffening is rounded in square fashion (with a rounding R of approximately 0.5 mm) and has an outer width of 5-7 mm.

Such solder pins or soldering inserts are advantageously produced as an SMT solder pin array as illustrated in FIG. 5, that is to say that the individual soldering inserts are connected to one another in a chain or even in a matrix via the mounting connections 19 and/or the soldering feet 6. In this case, the dimensions w, x, y can be 12, 48 and 60 mm, respectively. These SMT solder pins can therefore be arranged in a series or continuously (for example on a roll). Stamping after vulcanization.

SPECIFIC EMBODIMENTS

Short stroke 0.2 mm-0.8 mm (metal dome makes any selectable force-displacement curve and electrical contact)

Long stroke 0.8 mm-3 mm (silicone membrane makes any selectable force-displacement curve, contact pellet makes electrical contact)

With or Without LED

Specific Variants:

Contact pellet: all customary contact pellets can be used such as carbon pellet, gold pellet, SC pellet or else conductive lacquer. The choice of contact pellet depends on the electrical requirements made of the switching dome. The pellet diameter has to be adapted to the size of the parts (e.g. 2.5 mm).

Metal dome: the metal dome can have a geometry such as e.g. round or four-leg. The choice of metal dome depends on the force-displacement requirements made of the switching dome. The dome diameter has to be adapted to the size of the parts (e.g. 5.0 mm).

The metal dome can be fitted to the lower base either by adhesive bonding of the actuation plunger or by means of a customary adhesive film, and this is normally the last process step. It is likewise possible for metal domes to be adhesively bonded fixedly to the base by means of little fixing feet integrally formed for this purpose. Manufacturers of such metal domes are e.g. Nicomatic in Europe, Snaptron in USA or Truetone in Asia, to name just a few.

Force-displacement curve; by designing the correct membrane geometry or respectively the metal dome in combination with the silicone properties, it is possible to realize almost any desired curve according to customer specifications.

Component height: the key head can be configured with any desired height.

LED: a commercially available LED can be used; all that should be taken into consideration is the insulation size and suitability for SMT soldering or wire bonding (arrangement and quality of the soldering area). In this case, color, brightness, emission angle, etc. can be chosen from a wide range. Example: Kingbright chip LED 0805, superbright with dimensions of 2 mm×1.25 mm×1.1 mm. It is also conceivable to integrate a possible series resistor.

LED Fixing:

Wire bonding: a wire-bonder can be used to produce a flexible connection between SMT solder pin and LED. In this case, there are gold or aluminum wires with different thicknesses. By way of example, gold wire having a thickness in the range of 30-150 µm has proved to be worthwhile, and in the case of gold wire a thickness in the region of 100 µm has proved to be particularly advantageous.

SMT soldering: in the case of the metal dome embodiment, the LED can be soldered directly on the SMT solder pin if the latter is provided with two flexible lugs since here it is only necessary to overcome a small stroke in a flat membrane.

SMT Solder Pin:

The SMT solder pin is designed as a stamped and bent part, but a conductive plastic part is also possible (3D-MID molded interconnect devices).

Material is preferably CuFe3P with a 2 µm thick nickel coating (Ni), but can also be e.g. bronze or stainless steel (SAE 1008).

The region of the little soldering feet is preferably tin-plated (Sn) for lead-free SMT soldering onto the printed circuit board without any problems.

The region for the wire bonding is ideally coated with 0.2 µm of gold (Au) for completely satisfactory adhesion.

The SMT solder pin can be present as a single part or contiguously in series as an array, e.g. with a separating gap for electrical isolation.

Key head: transparent silicone or milky colored silicone (diffusion of the light). Polished or rough surface (diffusion of the light). In the case of a polished surface, the silicone is clear like glass.

Production Method:

The part is preferably produced by compression molding, but it is also possible by transfer molding.

Fully automated liquid injection molding (LIM) with liquid silicone rubber (LSR) is expedient in the case of large numbers of items.

Advantages:
- very cost-effective since few components and simple method;
- automatic placement by means of SMT, delivery on rolls;
- with integrated LED for backlighting as an option;
- LED integrated in key head brings light where it is needed, and that is absolutely novel for a long stroke;
- LED and key are mounted on printed circuit board in one work operation, and that saves a mounting operation;
- LED is protected against ambient influences;
- extremely small structural size;
- highly variable, customer-specific solution possible in a simple manner;
- both with short stroke 0.2 mm-0.8 mm (metal dome) and with long stroke 0.8 mm-3 mm (switching mat);
- large choice of force-displacement characteristic curves (tailored to customer requirements);
- many contact pellets possible;
- one system for all requirements;
- no loose parts since SMT solder pin and LED are embedded directly in the component;
- temperature range −40° C.-+110° C.

Applications (Examples):
- as key/switch for any input device where a key is actuated by means of a plastic cap;
- replaces present-day switching mats e.g. for input devices in an automobile (window winding mechanism, mirror adjuster, radio);
- replaces conventional tact switches since LED identically integrated and by virtue of being cheaper.

The invention claimed is:

1. A key for intermittent electrical contact-connection of at least two conductors arranged on a printed circuit board to at least one electrically conductive contact element, the key comprising:
at least one base arranged on the printed circuit board; and
a key head, which is movable relative to the printed circuit board and the base, positioned such that the at least one contact element is arranged underneath,
wherein the key head is connected to the base by means of at least one movable membrane, and the base and membrane are composed of an insulating elastic material,
wherein the key has at least one soldering foot which is incorporated by a first end thereof in the base in a positively locking manner, and the key is fixed on the printed circuit board by a second end of the soldering foot,
wherein the soldering foot includes one of a circumferential stiffening and a circumferentially and sectionally interrupted stiffening having a plane arranged parallel to the plane of the printed circuit board incorporated completely in the base,
wherein the soldering foot further includes, at said stiffening, a vertical section which is arranged substantially perpendicular to a plane of the printed circuit board and which is incorporated completely in the base and at a lower end of which said soldering region is arranged, and
wherein the soldering foot, adjacent to said vertical section, further includes a planar soldering region projecting laterally and bearing on the printed circuit board and parallel thereto.

2. The key as claimed in claim 1, wherein two soldering feet are arranged on opposite sides of the key.

3. The key as claimed in claim 1, wherein the base is embodied as an element which, on the printed circuit board, runs around the position of the conductors to be contact-connected and from which the at least one soldering foot projects laterally.

4. The key as claimed in claim 1, wherein the stiffening is a perforated disk having a plane arranged parallel to a plane of the printed circuit board.

5. The key as claimed in claim 1, wherein the stiffening and the soldering foot are connected to one another or are formed in one piece.

6. The key as claimed in claim 1, wherein the key head is at least partly composed of transparent or translucent material, and wherein there is arranged in the key head an illumination element.

7. The key as claimed in claim 6, wherein the illumination element is an LED, which is essentially completely enclosed by the material of the key head.

8. The key as claimed in claim 6, wherein the contact-connection of the illumination element is effected by means of two soldering feet.

9. The key as claimed in claim 8, wherein the illumination element is contact-connected to the two soldering feet by two contact-connection elements which are incorporated in the membrane.

10. The key as claimed in claim 9, wherein a circumferential stiffening interrupted at two locations is arranged in the base, and wherein the contact-connection elements produce an electrical contact between the illumination element and the stiffening.

11. The key as claimed in claim 10, wherein said stiffening is a perforated disk having a plane arranged parallel to a plane of the printed circuit board.

12. The key as claimed in claim 10, wherein two oppositely arranged soldering feet are arranged, and wherein, at least during production, at least two intervening, likewise oppositely arranged mounting connections are arranged, which have a separating gap leading to interruption of the stiffening.

13. The key as claimed in claim 1, wherein at least one indicator for the connecting direction of the illumination element is arranged in and/or on the key head.

14. The key as claimed in claim 1, wherein the soldering feet and the stiffening are composed of an electrically conductive material, and are produced in one piece in a stamping and forming process.

15. A key for intermittent electrical contact-connection of at least two conductors arranged on a printed circuit board to at least one electrically conductive contact element, the key comprising:
at least one base arranged on the printed circuit board; and
a key head, which is movable relative to the printed circuit board and the base, positioned such that the at least one contact element is arranged underneath,
wherein the key head is connected to the base by means of at least one movable membrane, and the base and membrane are composed of an insulating elastic material,
wherein the key has at least one soldering foot which is incorporated by a first end thereof in the base in a positively locking manner, and the key is fixed on the printed circuit board by a second end of the soldering foot, and
wherein the soldering foot takes the form of a soldering insert incorporated in the base,
the soldering insert having one of a circumferential stiffening and a circumferentially and sectionally interrupted stiffening which is incorporated substantially completely in the base and which is a perforated disk having a plane arranged parallel to the plane of the printed circuit board, at which stiffening there are arranged a vertical section which is arranged substantially perpendicular to the plane of the printed circuit board and which is incorporated substantially completely in the base, and, adjacent to the vertical section, a planar soldering region bearing on the printed circuit board and parallel thereto.

16. A soldering insert for a key for intermittent electrical contact-connection of at least two conductors arranged on a printed circuit board to at least one electrically conductive contact element, the key comprising:

at least one base arranged on the printed circuit board; and a key head, which is movable relative to the printed circuit board and the base, positioned such that the at least one contact element is arranged underneath, wherein the key head is connected to the base by means of at least one movable membrane, and the base and membrane are composed of an insulating elastic material, wherein the key has at least one soldering foot which is incorporated by a first end thereof in the base in a positively locking manner, and the key is fixed on the printed circuit board by a second end of the soldering foot, and wherein the soldering foot takes the form of a soldering insert incorporated in the base, the soldering insert having one of a circumferential stiffening and a circumferentially and sectionally interrupted stiffening which is incorporated substantially completely in the base and which is a perforated disk having a plane arranged parallel to a plane of the printed circuit board, at which stiffening there are arranged a vertical section which is arranged substantially perpendicular to the plane of the printed circuit board and which is incorporated substantially completely in the base, and, adjacent to said vertical section, a planar soldering region bearing on the printed circuit board and parallel thereto.

17. A two- and/or three-dimensional arrangement of keys as claimed in claim 1, claim 15, or of soldering inserts as claimed in claim 16, wherein the keys or the soldering inserts, respectively, are connected to one another by means of the soldering feet and/or the mounting connections.

18. A method for producing a key as claimed in claim 1, claim 15, or for producing an arrangement as claimed in claim 17, comprising the steps of:

introducing the contact pellet, the soldering feet or the soldering inserts, and also if appropriate an illumination element and contact-connection elements in an injection mold or compression mold, injecting insulating elastic material in the mold; and at least partly solidifying the insulating elastic material in the mold.

19. The method as claimed in claim 18, wherein an arrangement as claimed in claim 17 is produced and these are subsequently separated from one another to form single keys, along a separating edge which leads to formation of two sections of the stiffening which are electrically isolated from one another.

20. A key for intermittent electrical contact-connection of at least two conductors arranged on a printed circuit board to at least one electrically conductive contact element, the key comprising:

at least one base arranged on the printed circuit board; and a key head, which is movable relative to the printed circuit board and the base, positioned such that the at least one contact element is arranged underneath, wherein the key head is connected to the base by means of at least one movable membrane, and the base and membrane are composed of an insulating elastic material, wherein the key has at least one soldering foot which is incorporated by a first end thereof in the base in a positively locking manner, and the key is fixed on the printed circuit board by a second end of the soldering foot, wherein the soldering foot further includes a vertical section which is arranged substantially perpendicular to a plane of the printed circuit board and which is incorporated completely in the base and at a lower end of which said soldering region is arranged, and wherein the soldering foot, adjacent to said vertical section, further includes a planar soldering region projecting laterally and bearing on the printed circuit board and parallel thereto.

* * * * *